(12) United States Patent
Nam et al.

(10) Patent No.: US 12,721,225 B2
(45) Date of Patent: Aug. 25, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Heejae Nam, Suwon-si (KR); Junyun Kweon, Suwon-si (KR); Wooju Kim, Suwon-si (KR); Junggeun Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 650 days.

(21) Appl. No.: 18/320,553

(22) Filed: May 19, 2023

(65) Prior Publication Data

US 2024/0387460 A1 Nov. 21, 2024

(30) Foreign Application Priority Data

Aug. 22, 2022 (KR) ........................ 10-2022-0104597

(51) Int. Cl.
*H10W 90/00* (2026.01)
*H10W 70/60* (2026.01)
(Continued)

(52) U.S. Cl.
CPC .......... *H10W 90/00* (2026.01); *H10W 70/611* (2026.01); *H10W 70/65* (2026.01);
(Continued)

(58) Field of Classification Search
CPC ..................... H01L 2225/06562; H10W 90/00
See application file for complete search history.

(56) References Cited

U.S. PATENT DOCUMENTS 5,482,735 A 1/1996 Miyauchi et al.
6,680,219 B2 1/2004 Reyes et al.
(Continued)

FOREIGN PATENT DOCUMENTS

KR 10-0914440 B1 8/2009
KR 10-2012-0019263 A 3/2012
(Continued)

OTHER PUBLICATIONS

Korean Office Action dated Jan. 15, 2026 issued in Korean Patent Application No. 10-2022-0104597.

*Primary Examiner* — Yu-Hsi D Sun
(74) *Attorney, Agent, or Firm* — Harness, Dickey & Pierce, P.L.C.

(57) ABSTRACT

A semiconductor package including a package substrate having an upper surface and a lower surface opposite to the upper surface, the package substrate having first substrate pads along a side portion thereof and second substrate pads outside the first substrate pads, being along the side portion, and arranged at positions higher than the first substrate pads, a first group of semiconductor chips sequentially stacked on the upper surface of the package substrate, and including at least one semiconductor chip, a second group of semiconductor chips sequentially stacked on the first group of semiconductor chips and including at least one semiconductor chip, first bonding wires electrically connecting chip pads of the first group of semiconductor chips to the first substrate pads, respectively, and second bonding wires electrically connecting chips pads of the second group of semiconductor chips to the second substrate pads, respectively may be provided.

18 Claims, 12 Drawing Sheets

(51) Int. Cl.

| | |
|---|---|
| ***H10W 70/65*** | (2026.01) |
| *H10W 70/685* | (2026.01) |
| *H10W 72/00* | (2026.01) |
| *H10W 74/10* | (2026.01) |
| *H10W 90/24* | (2026.01) |

(52) U.S. Cl.

CPC ........ *H10W 70/685* (2026.01); *H10W 72/884* (2026.01); *H10W 74/111* (2026.01); *H10W 90/24* (2026.01); *H10W 90/701* (2026.01); *H10W 90/732* (2026.01); *H10W 90/734* (2026.01); *H10W 90/752* (2026.01); *H10W 90/754* (2026.01)

(56) References Cited

U.S. PATENT DOCUMENTS

| | | | | |
|---|---|---|---|---|
| 7,579,217 | B2 | 8/2009 | Zhao et al. | |
| 8,860,219 | B2 | 10/2014 | Wu | |
| 9,064,716 | B2 | 6/2015 | Hoang et al. | |
| 9,136,252 | B2 | 9/2015 | Iida et al. | |
| 10,319,702 | B2 * | 6/2019 | Park | H01L 25/074 |
| 12,148,736 | B2 * | 11/2024 | Boo | H01L 25/50 |
| 2012/0138338 | A1 | 6/2012 | Kim et al. | |
| 2022/0059407 | A1 * | 2/2022 | Ono | H01L 21/563 |

FOREIGN PATENT DOCUMENTS

| | | | |
|---|---|---|---|
| KR | 10-1213187 | B | 12/2012 |
| KR | 10-2020-0128027 | A | 11/2020 |
| KR | 10-2021-0101355 | A | 8/2021 |
| KR | 10-2022-0094992 | A | 7/2022 |

* cited by examiner

SEMICONDUCTOR PACKAGE AND METHOD OF MANUFACTURING THE SEMICONDUCTOR PACKAGE

CROSS-REFERENCE TO RELATED APPLICATIONS

This application claims priority under 35 U.S.C. § 119 to Korean Patent Application No. 10-2022-0104597, filed on Aug. 22, 2022 in the Korean Intellectual Property Office (KIPO), the contents of which are herein incorporated by reference in their entirety.

BACKGROUND

1. Field

Example embodiments relate to semiconductor packages and/or methods of manufacturing the semiconductor package. More particularly, example embodiments relate to multi-chip packages having a plurality of stacked chips and/or methods of manufacturing the same.

2. Description of the Related Art

In a multi-chip package including a plurality of semiconductor chips is embedded therein, substrate pads used as portions of different input/output channels (I/O channels) may be arranged in at least two rows on one side of a package substrate. As the number of semiconductor chips increases and a distance between the substrate pads decreases in order for high capacity and high performance, interference occurs between bonding wires respectively connected to the substrate pads.

SUMMARY

Some example embodiments provide semiconductor packages capable of reducing process difficulty in a wire bonding process and providing improved reliability.

Some example embodiments provide methods of manufacturing the semiconductor package.

According to an example embodiment, a semiconductor package includes a package substrate having an upper surface and a lower surface opposite to the upper surface, the package substrate having first substrate pads and second substrate pads, the first substrate pads arranged along a side portion thereof, the second substrate pads arranged outside the first substrate pads, being along the side portion, and arranged at positions higher than the first substrate pads, a first group of semiconductor chips sequentially stacked on the upper surface of the package substrate, the first group of semiconductor chips including at least one semiconductor chip, a second group of semiconductor chips sequentially stacked on the first group of semiconductor chips, the second group of semiconductor chips including at least one semiconductor chip, first bonding wires electrically connecting first chip pads of the first group of semiconductor chips to the first substrate pads of the package substrate respectively, and second bonding wires electrically connecting second chips pads of the second group of semiconductor chips to the second substrate pads of the package substrate respectively.

According to an example embodiment, a semiconductor package includes a package substrate having an upper surface and a lower surface opposite to the upper surface, the package substrate having first substrate pads and second substrate pads, the first substrate pads arranged along a side portion thereof and having a first height from the upper surface, the second substrate pads arranged outside the first substrate pads, being along the side portion, and having a second height, which is greater than the first height, from the upper surface, a plurality of semiconductor chips sequentially stacked on the upper surface of the package substrate, the plurality of semiconductor chips including a first group of semiconductor chips and a second group of semiconductor chips, first bonding wires electrically connecting first chip pads of the first group of semiconductor chips to the first substrate pads of the package substrate, respectively, the first group of semiconductor chips including a lowermost semiconductor chip of the plurality of semiconductor chips, second bonding wires electrically connecting second chips pads of a second group of semiconductor chips to the second substrate pads of the package substrate, respectively, the second group of semiconductor chips including an uppermost semiconductor chip of the plurality of semiconductor chips, and a molding member on the upper surface of the package substrate to cover the plurality of semiconductor chips.

According to an example embodiment, a semiconductor package includes a package substrate having an upper surface and a lower surface opposite to the upper surface, the package substrate having a stepped portion that extends along a side portion thereof and protrudes from the upper surface thereof to have a thickness, a substrate pad portion having first substrate pads arranged on the upper surface of the package substrate and second substrate pads arranged on the stepped portion along the side portion, a first semiconductor chip arranged on the upper surface of the package substrate, a spacer chip arranged on the upper surface of the package substrate and spaced apart from the first semiconductor chip, a plurality of semiconductor chips sequentially stacked on the first semiconductor chip and the spacer chip, first bonding wires electrically connecting first chip pads of a first group of the plurality of semiconductor chips to the first substrate pads of the package substrate, respectively, the first group of semiconductor chips including a lowermost semiconductor chip of the plurality of semiconductor chips, second bonding wires electrically connecting second chips pads of a second group of plurality of semiconductor chips to the second substrate pads of the package substrate, respectively, the second group of plurality of semiconductor chips including an uppermost semiconductor chip of the plurality of semiconductor chips, and a molding member on the upper surface of the package substrate to cover the first semiconductor chip, the spacer chip and the plurality of semiconductor chips.

According to an example embodiment, a semiconductor package may include a package substrate having first substrate pads arranged along a side portion and second substrate pads arranged outside the first substrate pads along the side portion and arranged at positions higher than the first substrate pads, first semiconductor chips sequentially stacked on the package substrate, first bonding wires electrically connecting first chip pads of a first group of the first semiconductor chips including a lowermost second semiconductor chip among the first semiconductor chips to the first substrate pads, respectively, and second bonding wires electrically connecting second chip pads of a second group of the second semiconductor chips among the second semiconductor chips to the second substrate pads, respectively.

Because the first substrate pads and the second substrate pads arranged along the side surface of the package substrate are located at different heights, interference between the first and second bonding wires that are connected to the first and second bonding pads, respectively, may be mitigated or prevented. Accordingly, process difficulty in a bonding wire process may be reduced and reliability may be improved.

BRIEF DESCRIPTION OF THE DRAWINGS

Example embodiments will be more clearly understood from the following detailed description taken in conjunction with the accompanying drawings. FIGS. 1 to 12 represent non-limiting, example embodiments as described herein.

FIG. 1 is a cross-sectional view illustrating a semiconductor package in accordance with an example embodiment.

FIG. 2 is a plan view illustrating the semiconductor package in FIG. 1.

FIG. 3 is an enlarged cross-sectional view illustrating portion 'A' in FIG. 1.

FIG. 4 is a partial perspective view illustrating first and second bonding wires of the semiconductor package in FIG. 3.

FIG. 5 is a block diagram illustrating signal transmission channels in the semiconductor package in FIG. 1.

FIGS. 6 to 10 are cross-sectional views illustrating a method of manufacturing a semiconductor package in accordance with an example embodiment.

FIG. 11 is a cross-sectional view illustrating a semiconductor package in accordance with an example embodiment.

FIG. 12 is a block diagram illustrating signal transmission channels in the semiconductor package in FIG. 11.

DETAILED DESCRIPTION

Hereinafter, some example embodiments will be explained in detail with reference to the accompanying drawings.

While the term "same," "equal" or "identical" and numerical values is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
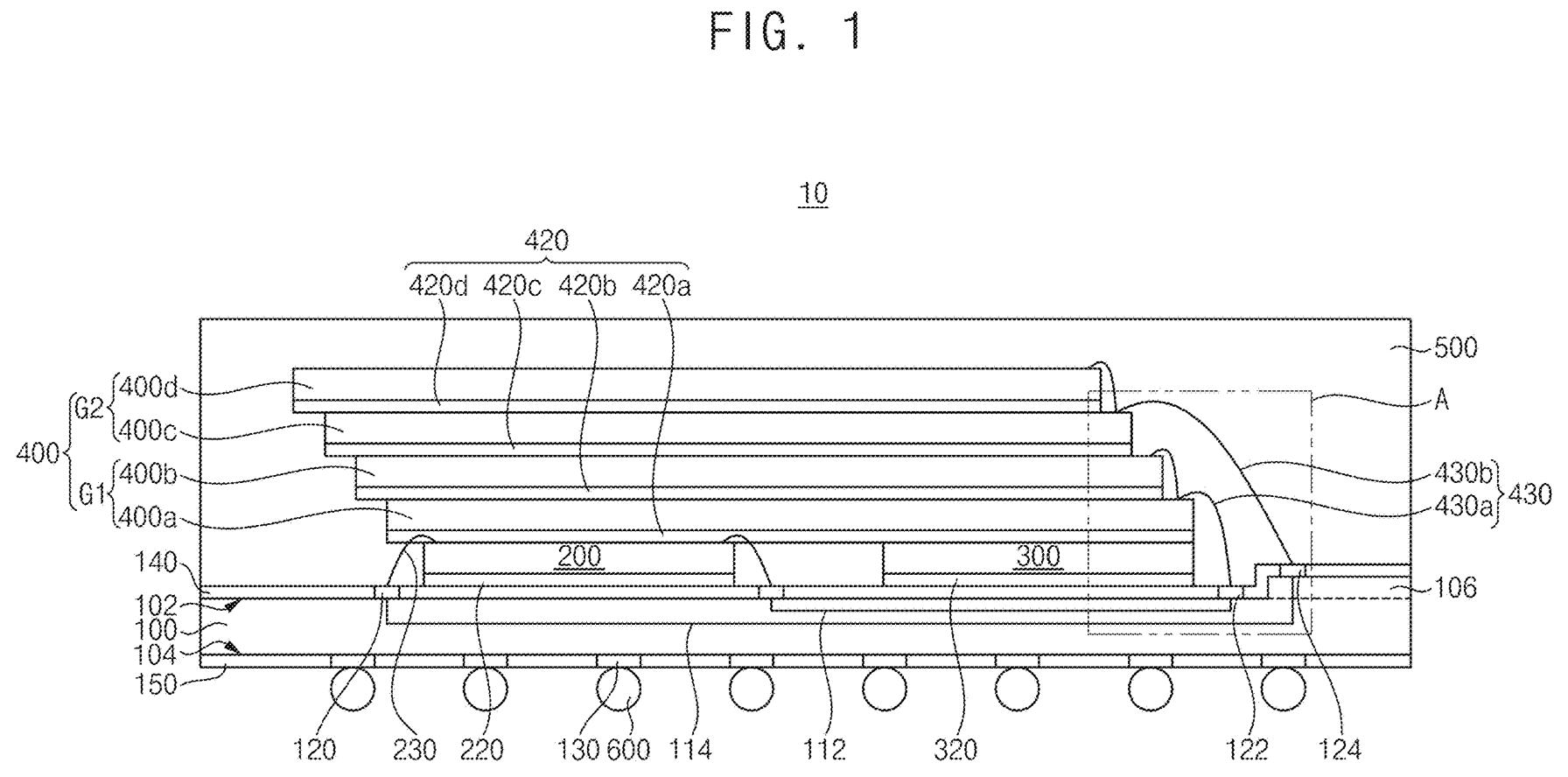
Figure 2:
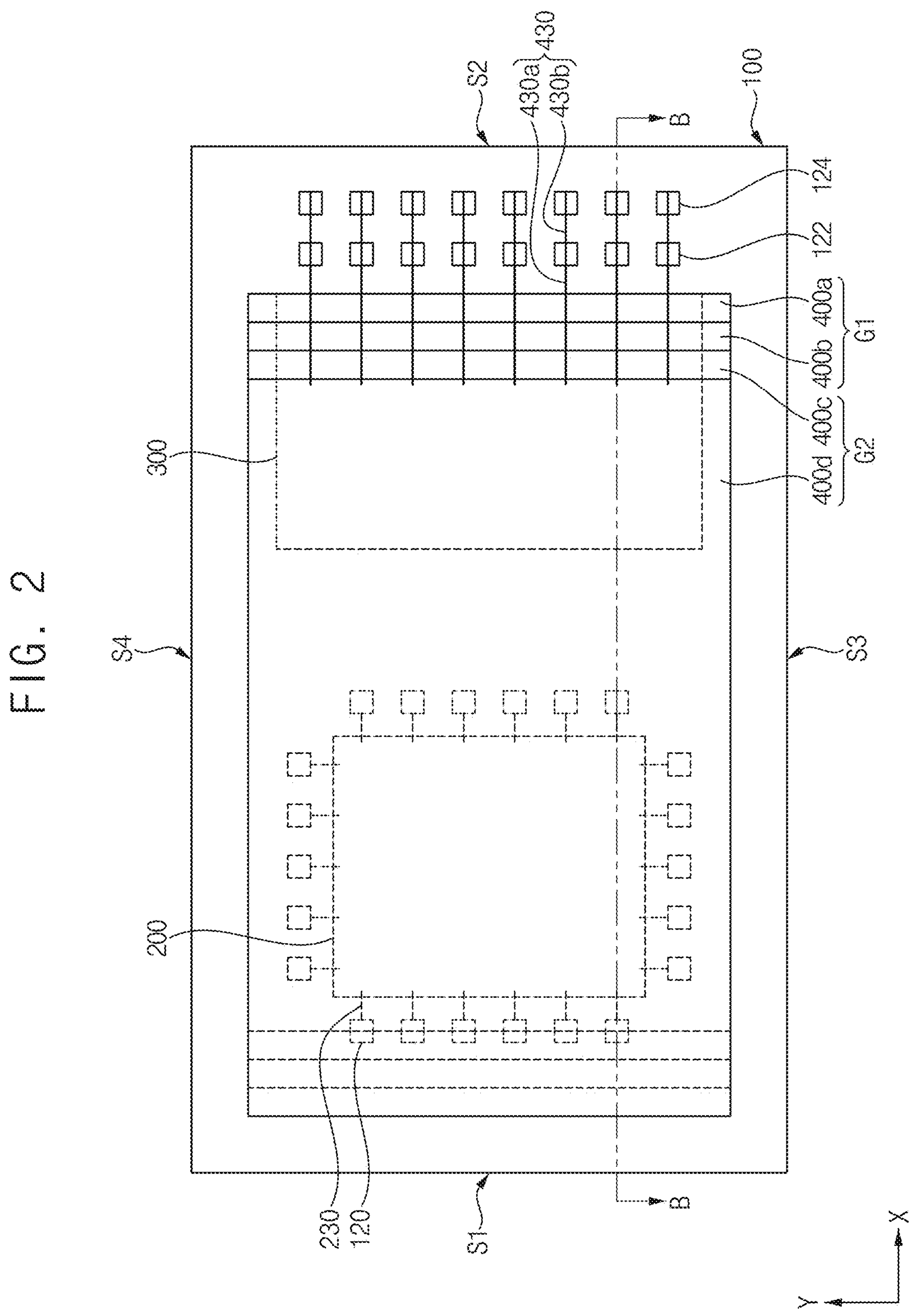
Figure 3:
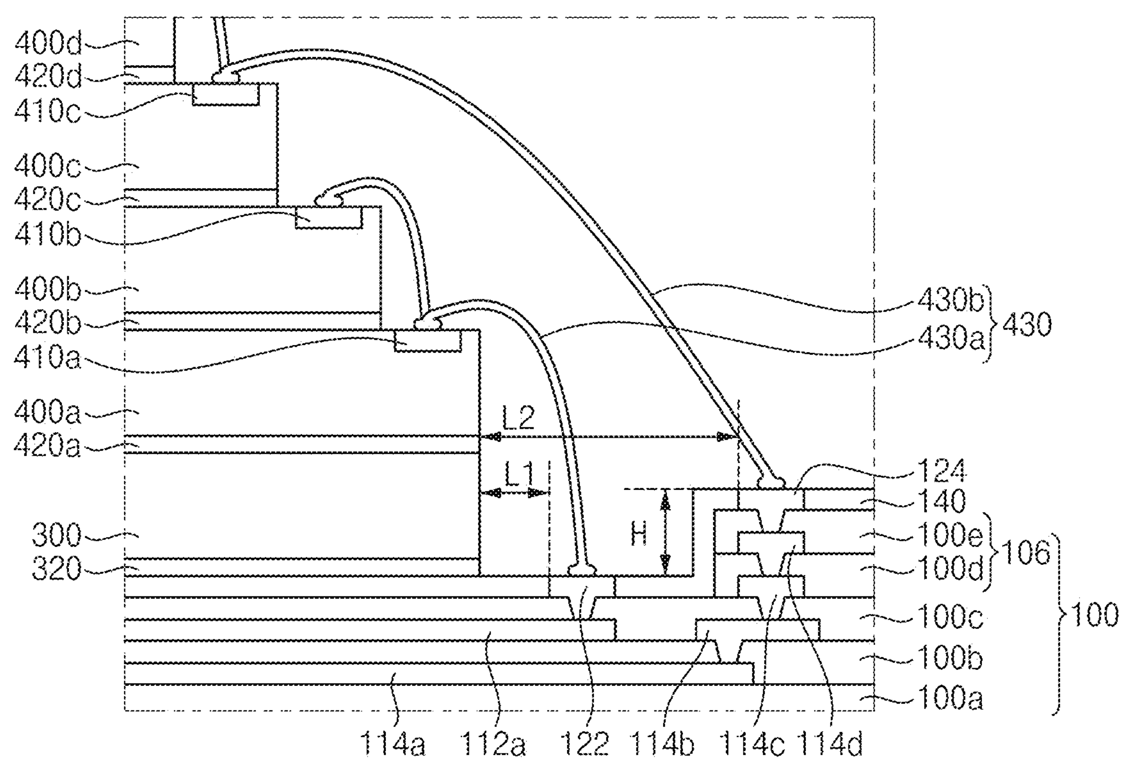
Figure 4:
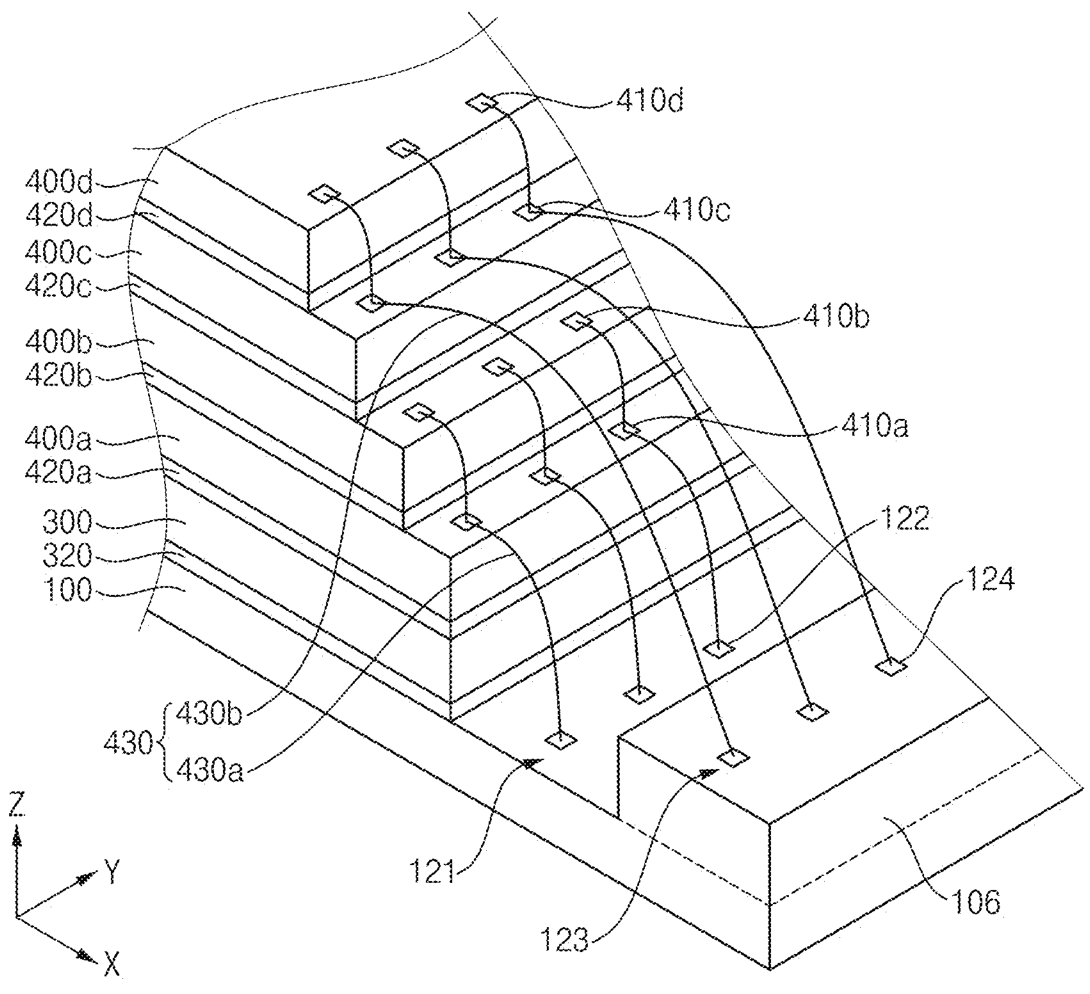
Figure 5:
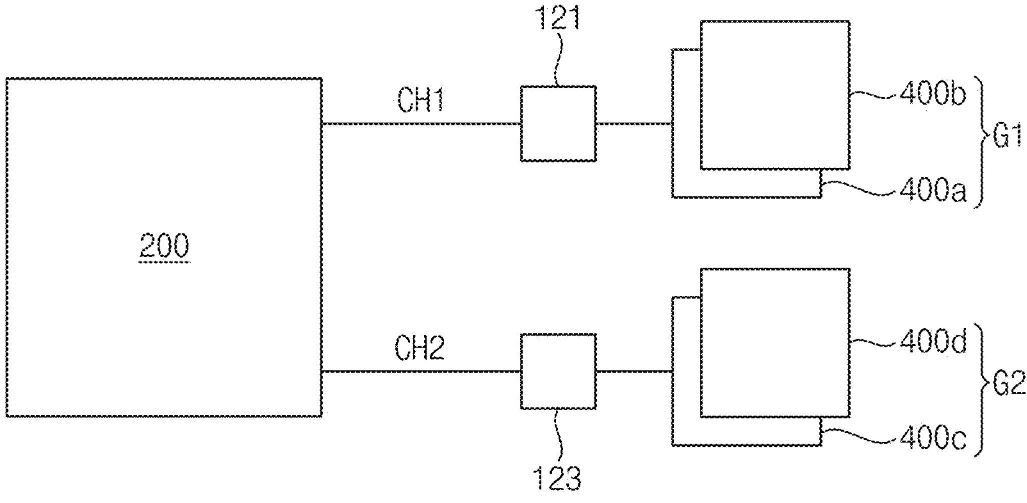

FIG. 1 is a cross-sectional view illustrating a semiconductor package in accordance with an example embodiment. FIG. 2 is a plan view illustrating the semiconductor package in FIG. 1. FIG. 3 is an enlarged cross-sectional view illustrating portion 'A' in FIG. 1. FIG. 4 is a partial perspective view illustrating first and second bonding wires of the semiconductor package in FIG. 3. FIG. 5 is a block diagram illustrating signal transmission channels in the semiconductor package in FIG. 1. FIG. 1 is a cross-sectional view taken along the line B-B' in FIG. 2.

Referring to FIGS. 1 to 5, a semiconductor package 10 may include a package substrate 100, a first semiconductor chip 200, a spacer chip 300, a plurality of second semiconductor chips 400 and a molding member 500. Additionally, the semiconductor package 10 may further include outer connection members 600.

For example, the semiconductor package 10 may be a multi-chip package (MCP) including different kinds of semiconductor chips. The semiconductor package 10 may be a System-In-Package (SIP) including a plurality of semiconductor chips stacked or arranged in one package to perform all or some of the functions of an electronic system.

In some example embodiments, the package substrate 100 may be a substrate having an upper surface 102 and a lower surface 104 opposite to the upper surface 102. For example, the package substrate 100 may include a printed circuit board (PCB), a flexible substrate, a tape substrate, etc. The package substrate may include a multi circuit board having vias and various circuit elements therein. The package substrate 100 may include wirings 112, 114 therein as channels for electrical connection between the first semiconductor chip 200 and the second semiconductor chips.

As illustrated in FIG. 2, the package substrate 100 may include first and second side surfaces S1 and S2 extending in a direction perpendicular to the upper surface and parallel to a second direction (Y direction) and facing each other and third and fourth side surfaces S3 and S4 extending in a direction parallel to a first direction (X direction) perpendicular to the second direction and facing each other.

Substrate pads 120, 122, 124 may be arranged on the upper surface 102 of the package substrate 100. The substrate pads 120, 122, 124 may be connected to the wirings, respectively. The wirings may extend on the upper surface 102 of the package substrate 100 or inside the package substrate 100. For example, at least a portion of the wiring may be used as the substrate pad, that is, a landing pad.

Although some substrate pads are illustrated as an example, the number and locations of the substrate pads according to example embodiments are limited thereto. Because the wirings as well as the substrate pads are well known in the art to which the present inventive concepts pertain, illustration and description concerning such elements will be omitted.

A first insulation layer 140 may be formed on the upper surface 102 of the package substrate 100 to expose the substrate pads 120, 122, 124. The first insulation layer 140 may cover the entire upper surface 102 of the package substrate 100 except the substrate pads 120, 122, 124. For example, the first insulation layer may include solder resist.

In some example embodiments, the substrate pads may include first pads 120 for electrical connection with the first semiconductor chip 200, first substrate pads 122 of a first substrate pad portion 121 provided as a portion of a first channel CH1, and second substrate pads 124 of a second substrate pad portion 123 provided as a portion of a second channel CH2. The first substrate pads 122 may constitute a portion of the first channel CH1 and the second substrate pads 124 may constitute a portion of the second channel CH2.

The first pads 120 may be arranged around a first mounting region where the first semiconductor chip 200 is mounted, to be spaced apart from each other. The first substrate pads 122 and the second substrate pads 124 may be arranged along the second side surface S2 of the package substrate 100 to be spaced apart from each other. When viewed from plan view, the second substrate pads 124 may be arranged outside the first substrate pads 122.

In some example embodiments, the first semiconductor chip 200 may be mounted on the package substrate 100. The first semiconductor chip 200 may be adhered onto the upper surface 102 of the package substrate 100 by an adhesive member 220. For example, the adhesive member 220 may include an adhesive film such as a direct adhesive film (DAF). The first semiconductor chip 200 may include an integrated circuit. For example, the first semiconductor chip 200 may be a logic chip including a logic circuit. The logic chip may be a controller for controlling memory chips. The first semiconductor chip may be a processor chip (e.g., Application Specific IC (ASIC) for host, CPU, GPU, or System-On-Chip (SoC)).

The first semiconductor chip 200 may include chip pads on an upper surface, that is, an active surface. The chip pads may include an input/output terminal serving as a power pin, an input/output terminal serving as a ground pin and/or an input/output terminal serving as a data pin.

The first semiconductor chip 200 may be electrically connected to the package substrate 100 by conductive connection members 230. For example, the conductive connection member 230 may electrically connect the chip pad of the first semiconductor chip 200 to the substrate pad 120 of the package substrate 100. For example, the conductive connection member 230 may include a bonding wire. Accordingly, the first semiconductor chip 200 may be stacked on the package substrate 100 by the adhesive member 220 and may be electrically connected to the package substrate 100 by a plurality of the conductive connection members 230.

For example, a thickness of the first semiconductor chip may be within a range of from 40 μm to 60 μm, and a thickness of the adhesive member may be within a range of from 15 μm to 25 μm.

In some example embodiments, the spacer chip 300 as a support structure may be arranged on the upper surface 102 of the package substrate 100 to be spaced apart from the first semiconductor chip 200. The spacer chip 300 may be attached to the upper surface 102 of the package substrate 100 using an adhesive film 320. The spacer chip 300 may be disposed between the package substrate 100 and other electronic components to support other electronic components.

For example, the adhesive film 320 may include a die attach film (DAF). A height of the spacer chip 300 from the package substrate 100 may be the same as or substantially similar to a height of the first semiconductor chip 200. The spacer chip 300 may be a dummy chip that is not electrically connected to the package substrate 100.

In some example embodiments, a plurality of the second semiconductor chips 400 may be stacked on the first semiconductor chip 200 and the spacer chip 300 on the package substrate 100. The second semiconductor chips 400*a*, 400*b*, 400*c*, 400*d* may be sequentially adhered on the spacer chip 300 using adhesive members 420*a*, 420*b*, 420*c*, 420*d*. For example, the adhesive member may include an adhesive film such as a direct adhesive film (DAF). A planar area of the second semiconductor chip may be greater than a planar area of the first semiconductor chip or the spacer chip. Accordingly, the second semiconductor chips 400*a*, 400*b*, 400*c*, 400*d* may be supported and mounted on the package substrate 100 by the spacer chip 300.

The second semiconductor chips 400 may include memory chips including memory circuits. For example, the second semiconductor chips 400 may include a non-volatile memory device (e.g., DRAM or NAND flash memory). The second semiconductor chip may have a thickness of 40 μm to 60 μm. The number, size, arrangement, etc. of the second semiconductor chips are provided as examples, and it will be understood that example embodiments not limited thereto.

The second semiconductor chips may be offset-aligned sequentially or in a zigzag direction. For example, the second semiconductor chips 400*a*, 400*b*, 400*c*, 400*d* may be stacked in a cascade structure. The second semiconductor chips 400*a*, 400*b*, 400*c*, 400*d* may be sequentially offset-aligned in a first lateral direction (left direction) of the package substrate 100.

The second semiconductor chips 400 may include a first group G1 of second semiconductor chips and a second group G2 of second semiconductor chips. The first group G1 of the second semiconductor chips as a first stack structure may be sequentially stacked on the first semiconductor chip 200 on the upper surface 102 of the package substrate 100, and may include at least two second semiconductor chips 400*a*, 400*b*. The first group G1 of second semiconductor chips may include a lowermost semiconductor chip 400*a* among the second semiconductor chips 400. The second group G2 of the second semiconductor chips as a second stack structure may be sequentially stacked on the first group G1 of the second semiconductor chips, and may include at least two second semiconductor chips 400*c*, 400*d*. The second group G2 of second semiconductor chips may include an uppermost semiconductor chip 400*d* among the second semiconductor chips 400.

A thickness of the lowermost second semiconductor chip 400*a* of the second semiconductor chips 400 may be greater than a thickness of other second semiconductor chips. The second semiconductor chips 400*a*, 400*b*, 400*c*, 400*d* may be supported and mounted on the package substrate 100 by the spacer chip 300. An area of the lowermost second semiconductor chip 400*a* may be greater than an area of the underlying first semiconductor chip 200. Because the lowermost first memory chip 300*a* has a relatively greater thickness, cracks may be mitigated or prevented from occurring in the lowermost second semiconductor chip 400*a*.

In some example embodiments, the second semiconductor chips 400 may be electrically connected to the package substrate 100 by conductive connection members 430.

For example, chip pads of the first group G1 of second semiconductor chips 400*a*, 400*b* may be electrically connected to the first substrate pads 122 by first bonding wires 430*a*. Chip pads of the second group G2 of second semiconductor chips 400*c*, 400*d* may be electrically connected to the second substrate pads 124 by second bonding wires 430*b*.

As illustrated in FIG. 5, the second semiconductor chips 400 may be electrically connected to the first semiconductor chip 200 by two channels CH1 and CH2.

The first group G1 of the second semiconductor chips 400*a*, 400*b* may be electrically connected to the first semiconductor chip 200 by a first channel CH1. Two second semiconductor chips 400*a*, 400*b* may share the first channel CH1. A first wiring 112 and the first substrate pad portion 121 of the package substrate 100 may constitute a portion of the first channel CH1.

The second group G2 of the second semiconductor chips 400*c*, 400*d* may be electrically connected to the first semiconductor chip 200 by a second channel CH2. Two second semiconductor chips 400*c*, 400*c* may share the second channel CH2. A second wiring 114 and the second substrate pad portion 123 of the package substrate 100 may constitute a portion of the second channel CH2.

As illustrated in FIGS. 3 and 4, in an example embodiment, the second substrate pads 124 may be arranged at higher positions than the first substrate pads 122. The first substrate pads 122 have a first height from the upper surface 102 of the package substrate 100, and the second substrate pads 124 have a second height, which is greater than the first height, from the upper surface 102 of the package substrate 100.

For example, the package substrate 100 may have a stepped portion 106 that extends along the second side portion S2 and protrudes from the upper surface 102 to have a desired (or alternatively, predetermined) thickness T. The second substrate pads 124 may be disposed on the stepped portion 106. The second substrate pad 124 may be electrically connected to connection wirings 114*a*, 114*b*, 114*c*, 114*d* formed in the wiring layers 100*a*, 100*b*, 100*c*, 100*d*, 100*e* of the package substrate 100. The thickness T of the stepped portion 106 may be within a range of 20 μm to 60 μm. A difference H between the second height of the second substrate pad 124 and the first height of the first substrate pad 122 may be within a range of 20 μm to 60 μm.

When viewed from plan view, a minimum distance (L1) between the first substrate pad 122 and the second semiconductor chip 400 may be at least 400 μm, and a minimum distance (L2) between the second substrate pad 124 and the second semiconductor chip 400 may be at least 550 μm.

When viewed from plan view, the first bonding wire 430*a* and the second bonding wire 430*b* that connect the chip pads of the second semiconductor chips 400*a*, 400*b*, 400*c*, 400*d* of the first and second groups arranged on the same line along one direction (X direction) to the first and second substrate pads, respectively, may partially overlap each other. That is, the second bonding wire 430*b* may extend above the first bonding wire 430*a*, and the second bonding wire 430*b* and the underlying first bonding wire 430*a* may partially overlap each other. In other words, when viewed from plan view, at least one of the first bonding wires 430*a* may connect a first subset of the first chip pads 410*a*, 410*b* to a corresponding one of the first substrate pads 122, at least one of the second bonding wires 430*b* may connect a second subset of the second chip pads 410*c* to a corresponding one of the second substrate pads 124, the first subset of the first chip pads 410*a*, 410*b* and the second subset of the second chip pads 410*c* may be arranged on a same line along one direction, and the at least one of the first bonding wires 430*a* and the at least one of the second bonding wires 430*b* may partially overlap each other.

In some example embodiments, the molding member 500 may be formed on the upper surface 102 of the package substrate 100 to cover the first semiconductor chip 200, the spacer chip 300 and the second semiconductor chips 400. The molding member 500 may include epoxy molding compound (EMC).

Outer connection pads 130 for supplying an electrical signal may be formed on the lower surface 104 of the package substrate 100. The outer connection pads 130 may be exposed from a second insulation layer 150. The second insulation layer may include a silicon oxide layer, a silicon nitride or a silicon oxynitride layer. The outer connection member 600 for electrical connection with an external device may be disposed on the outer connection pad 130. For example, the outer connection member 600 may include a solder ball. The semiconductor package 10 may be mounted on a module substrate (not illustrated) via the solder balls to form a memory module.

As mentioned above, the semiconductor package 10 may include the package substrate 100 having the first substrate pads 122 arranged along the second side portion S2 and the second substrate pads 124 arranged outside the first substrate pads 124 along the second side portion S2 and arranged at positions higher than the first substrate pads 122, the second semiconductor chips 400 sequentially stacked on the package substrate 100, the first bonding wires 430*a* electrically connecting the chip pads 410*a*, 410*b* of the first group of the second semiconductor chips including the lowermost second semiconductor chip 400*a* among the second semiconductor chips 400 to the first substrate pads 122 of the package substrate 100 respectively, and the second bonding wires 430*b* electrically connecting the chip pads 410*c*, 410*d* of the second group G2 of the second semiconductor chips including the uppermost second semiconductor chip 400*b* among the second semiconductor chips 400 to the second substrate pads 124 of the package substrate 100, respectively.

Because the first substrate pads 122 and the second substrate pads 124 arranged along the second side surface S2 of the package substrate 100 and used as two different channels CH1 and CH2 are located at different heights, that is, the second substrate pads 124 arranged relatively outside are at a higher position, interference between the first and second bonding wires 430*a* and 430*b* connected to the first and second bonding pads 122 and 124 may be mitigated or prevented.

Accordingly, a bonding wire process may be performed more easily, and the yield and productivity of the bonding wire process may be improved.

Hereinafter, a method of manufacturing the semiconductor package in FIG. 1 will be explained.

FIGS. 6 to 10 are cross-sectional views illustrating a method of manufacturing a semiconductor package in accordance with an example embodiment.

Figure 6:
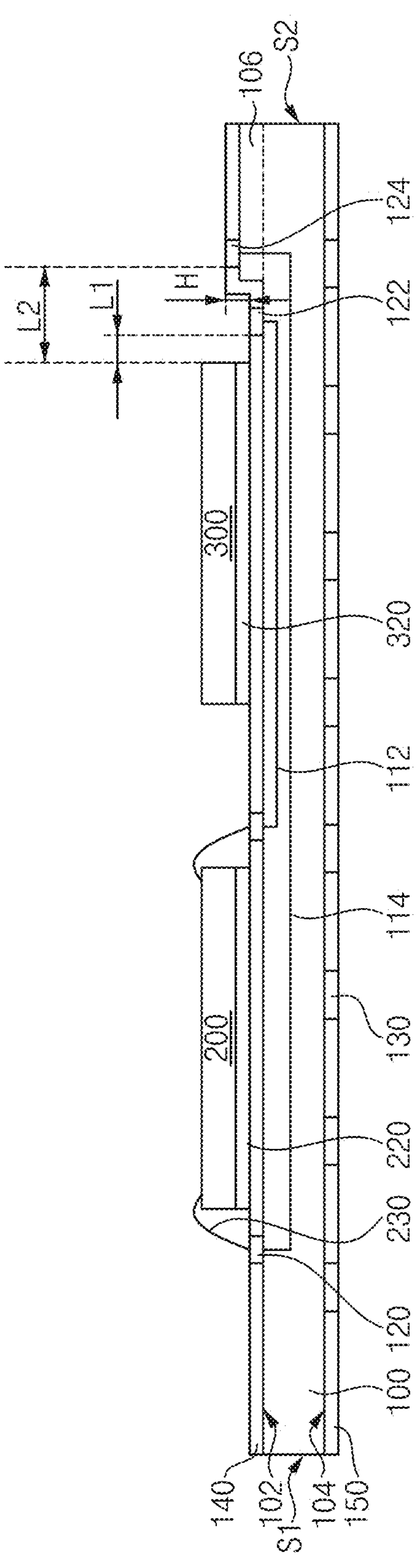

Referring to FIG. 6, a package substrate 100 having first substrate pads 122 and second substrate pads 124 may be provided, and a first semiconductor chip 200 and a spacer chip 300 may be arranged on the package substrate 100.

In some example embodiments, the package substrate 100 may be a substrate having an upper surface 102 and a lower surface 104 opposite to the upper surface. For example, the package substrate 100 may include a printed circuit board (PCB), a flexible substrate, a tape substrate, etc. The package substrate may be a multi circuit board having vias and various circuit elements therein. The package substrate 100 may include wirings 112, 114 as channels for electrical connection between the first semiconductor chip 200 and memory chips as described later.

The package substrate 100 may include first and second side surfaces S1 and S2 extending in a direction perpendicular to the upper surface and parallel to a second direction (Y direction) and facing each other and third and fourth side surfaces S3 and S4 extending in a direction parallel to a first direction (X direction) perpendicular to the second direction and facing each other.

Substrate pads 120, 122, 124 may be arranged on the upper surface 102 of the package substrate 100. The substrate pads 120, 122, 124 may be connected to the wirings, respectively. The wirings may extend on the upper surface 102 of the package substrate 100 or inside the package substrate 100. For example, at least a portion of the wiring may be used as the substrate pad, that is, a landing pad.

The substrate pads may include first pads 120 for electrical connection with the first semiconductor chip 200, the first substrate pads 122 of a first substrate pad portion provided as a portion of a first channel CH1, and the second substrate pads 124 of a second substrate pad portion provided as a portion of a second channel CH2. As will be described later, the first substrate pads 122 may constitute a portion of the first channel CH1 and the second substrate pads 124 may constitute a portion of the second channel CH2.

A first insulation layer 140 may be formed on the upper surface 102 of the package substrate 100 to expose the substrate pads 120, 122, 124. The first insulation layer 140 may cover the entire upper surface 102 of the package substrate 100 except the substrate pads 120, 122, 124. For example, the first insulation layer 140 may include solder resist.

The first pads 120 may be arranged around a first mounting region where the first semiconductor chip 200 is mounted, to be spaced apart from each other. The first substrate pads 122 and the second substrate pads 124 may be arranged along the second side surface S2 of the package substrate 100 to be spaced apart from each other. When viewed from plan view, the second substrate pads 124 may be arranged outside the first substrate pads 122.

In some example embodiments, the second substrate pads 124 may be arranged at higher positions than the first substrate pads 122. The first substrate pads 122 may have a first height from the upper surface 102 of the package substrate 100, and the second substrate pads 124 may have a second height, which is greater than the first height, from the upper surface 102 of the package substrate 100.

For example, the package substrate 100 may have a stepped portion 106 that extends along the second side portion S2 and protrudes from the upper surface 102 to have a desired (or alternatively, predetermined) thickness T. The second substrate pads 124 may be disposed on the stepped portion 106. The thickness T of the stepped portion 106 may be within a range of 20 μm to 60 μm. A difference H between the second height of the second substrate pad 124 and the first height of the first substrate pad 122 may be within a range of 20 μm to 60 μm.

The first semiconductor chip 200 may be adhered onto the upper surface 102 of the package substrate 100 by an adhesive member 220. For example, the adhesive member may include an adhesive film such as a direct adhesive film (DAF). The first semiconductor chip 200 may include an integrated circuit. For example, the first semiconductor chip 200 may be a logic chip including a logic circuit. The logic chip may be a controller for controlling memory chips. The first semiconductor chip may be a processor chip (e.g., ASIC for host, CPU, GPU, or SoC).

Then, a wire bonding process may be performed to electrically connect chip pads of the first semiconductor chip 200 to the substrate pads 120 on the upper surface 102 of the package substrate 100. The chip pads of the first semiconductor chip 200 may be electrically connected to the substrate pads 120 by first conductive connection members 230. For example, the first conductive connection member 230 may include bonding wires.

Then, the spacer chip 300 as a support structure may be attached onto the upper surface 102 of the package substrate 100 by using an adhesive film 320 to be spaced apart from the first semiconductor chip 200. At least one spacer chip 300 may be disposed in a side of the first semiconductor chip 200. The spacer chip 300 may be attached to the upper surface 102 of the package substrate 100 using the adhesive film 320 through a die attach process.

When viewed from plan view, a minimum distance (L1) between the first substrate pad 122 and the spacer chip 300 may be at least 400 μm, and a minimum distance (L2) between the second substrate pad 124 and the spacer chip 300 may be at least 550 μm.

Figure 7:
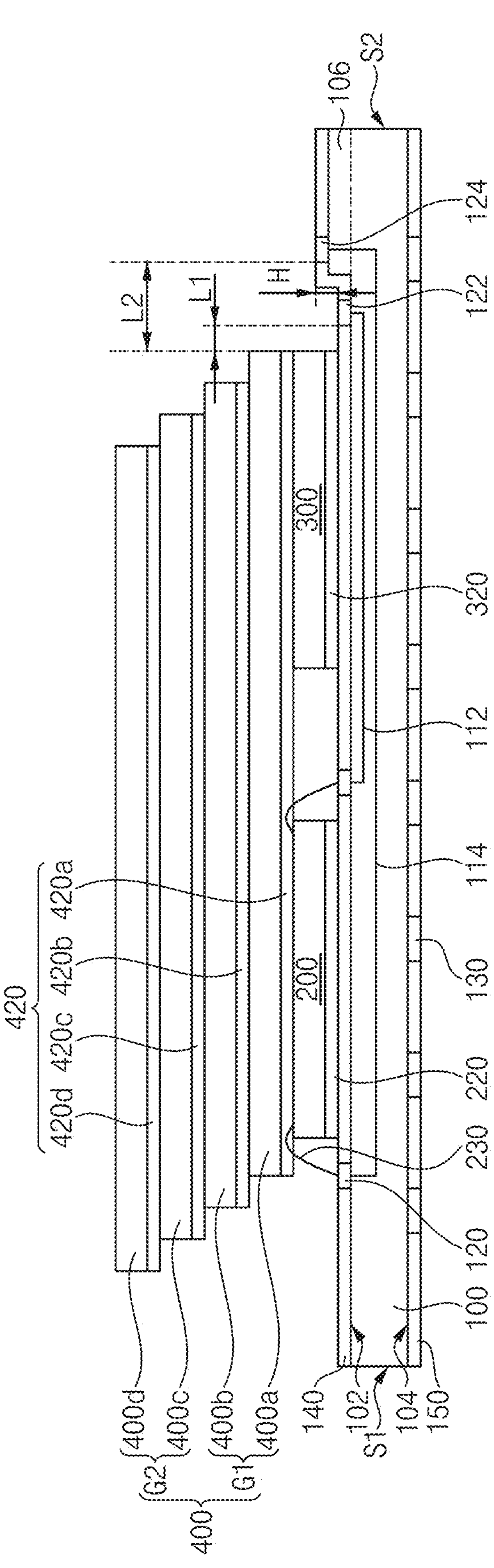

Referring to FIG. 7, a plurality of second semiconductor chips 400 may be stacked on the first semiconductor chip 200 and the spacer chip 300.

In some example embodiments, a die attach process may be performed to stack a plurality of the second semiconductor chips 400 on the first semiconductor chip 200. The second semiconductor chips 400*a*, 400*b*, 400*c*, 400*d* may be sequentially adhered on the spacer chip 300 using adhesive members 420*a*, 420*b*, 420*c*, 420*d*. For example, the second semiconductor chip may include a memory device (e.g., DRAM or NAND flash memory, etc. The adhesive members 420*a*, 420*b*, 420*c*, 420*d* may include an adhesive film such as a direct adhesive film (DAF).

For example, the second semiconductor chips may be sequentially offset-aligned. For example, the second semiconductor chips may be stacked in a cascade structure. The second semiconductor chips may be sequentially offset-aligned in a first lateral direction (left direction) of the package substrate 100.

The second semiconductor chips 400 may include a first group G1 of the second semiconductor chips and a second group G2 of the second semiconductor chips. The first group G1 of the second semiconductor chips as a first stack structure may be sequentially stacked on the first semiconductor chip 200 on the upper surface 102 of the package substrate 100, and may include at least two second semiconductor chips 400*a*, 400*b*. The first group of the second semiconductor chips may include a lowermost semiconductor chip 400*a* among the second semiconductor chips 400. The second group G2 of the second semiconductor chips of the as a second stack structure may be sequentially stacked on the first group G1 of the second semiconductor chips, and may include at least two second semiconductor chips 400*c*, 400*d*. The second group G2 of the second semiconductor chips may include an uppermost semiconductor chip 400*d* among the second semiconductor chips 400.

A thickness of the lowermost second semiconductor chip 400*a* of the second semiconductor chips 400 may be greater than a thickness of other second semiconductor chips. Accordingly, the second semiconductor chips 400*a*, 400*b*, 400*c*, 400*d* may be supported and mounted on the package substrate 100 by the spacer chip 300. An area of the lowermost second semiconductor chip 400*a* may be greater than an area of the underlying first semiconductor chip 200. Because the lowermost first memory chip 300*a* has a relatively greater thickness, cracks may be mitigated or prevented from occurring in the lowermost second semiconductor chip 400*a*.

Figure 8:
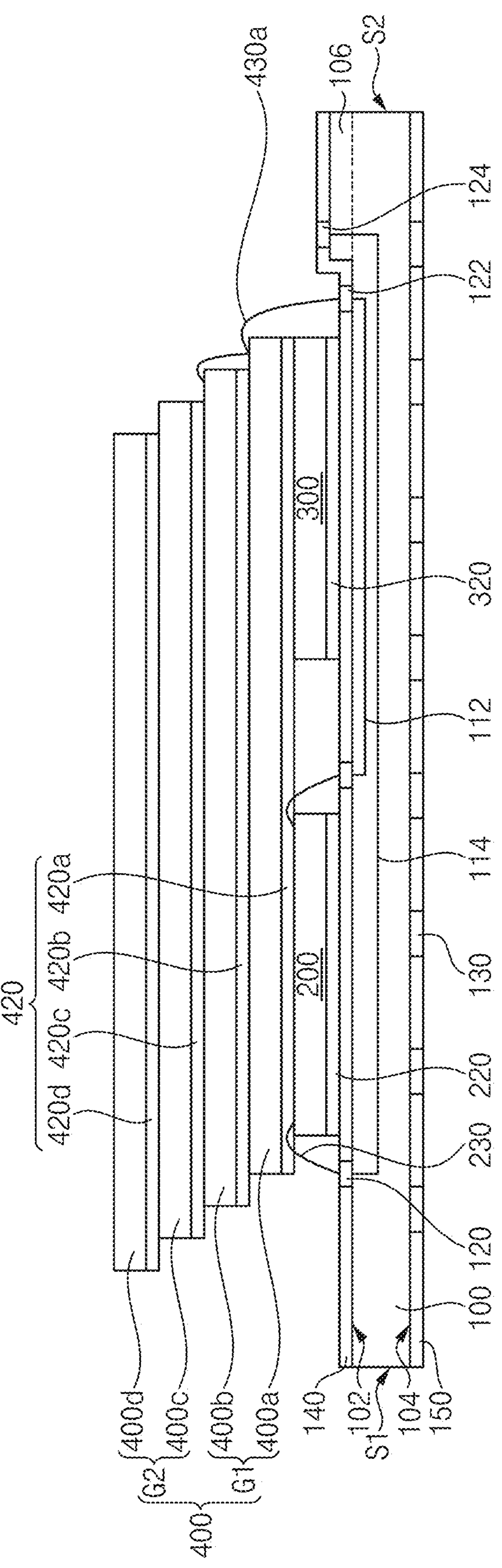
Figure 9:
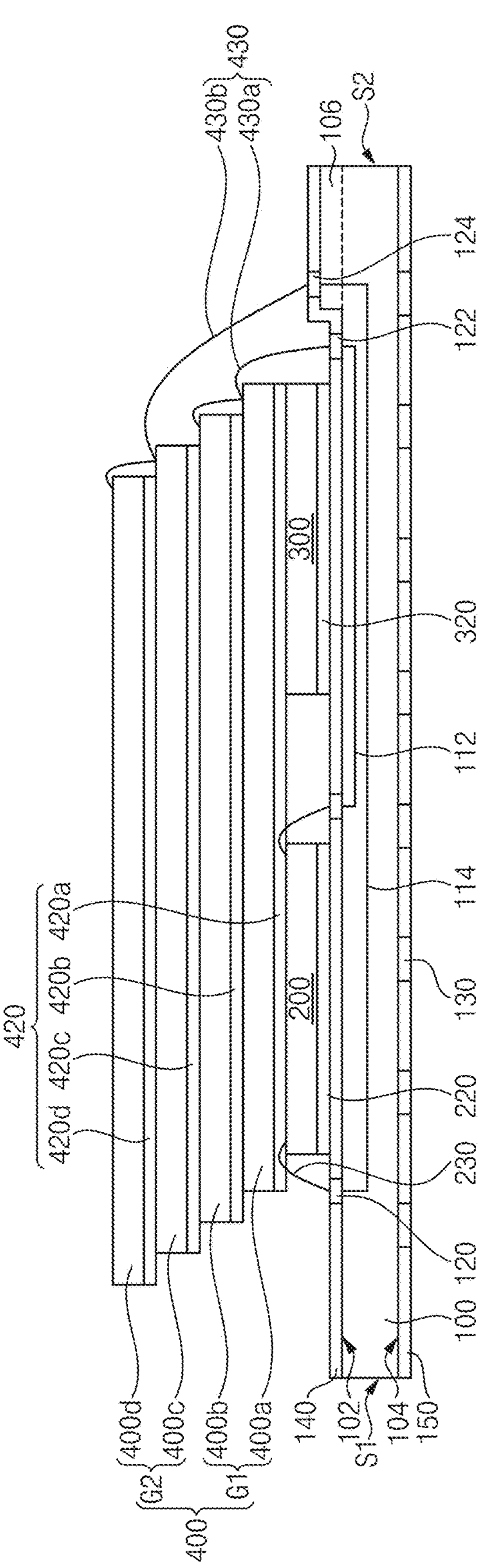

Referring to FIGS. 8 and 9, the second semiconductor chips 400 may be electrically connected to the package substrate 100 by conductive connection members 430.

As illustrated in FIG. 8, a wire bonding process may be performed to electrically connect chip pads of the first group G1 of the second semiconductor chips 400*a*, 400*b* to the first substrate pads 122 on the upper surface 102 of the package substrate 100 by first bonding wires 430*a*. The chip pads of the first group G1 of the second semiconductor chips 400*a*, 400*b* may be electrically connected to the first substrate pads 122 by the first bonding wires 430*a*.

As illustrated in FIG. 9, a wire bonding process may be performed to electrically connect chip pads of the second group G2 of the second semiconductor chips 400*c*, 400*d* to the second substrate pads 124 on the upper surface 102 of the package substrate 100 by second bonding wires 430*b*. The chip pads of the second group G2 of the second semiconductor chips 400*c*, 400*d* may be electrically connected to the second substrate pads 124 by the second bonding wires 430*b*.

The second semiconductor chips 400 may be electrically connected to the first semiconductor chip 200 by two channels CH1 and CH2.

The first group G1 of the second semiconductor chips 400*a*, 400*b* may be electrically connected to the first semiconductor chip 200 by a first channel CH1. Two second semiconductor chips 400*a*, 400*b* may share the first channel CH1. A first wiring 112 of the package substrate 100 may constitute a portion of the first channel CH1.

The second group G2 of the second semiconductor chips 400*c*, 400*d* may be electrically connected to the first semiconductor chip 200 by a second channel CH2. Two second semiconductor chips 400*c*, 400*c* may share the second channel CH2. A second wiring 114 of the package substrate 100 may constitute a portion of the second channel CH2.

In some example embodiments, when viewed from plan view, the first bonding wire 430*a* and the second bonding wire 430*b* that connect the chip pads of the second semiconductor chips 400*a*, 400*b*, 400*c*, 400*d* of the first and second groups arranged on the same line along one direction (X direction) to the first and second substrate pads, respectively may partially overlap each other. That is, the second bonding wire 430*b* may extend above the first bonding wire 430*a*, and the second bonding wire 430*b* and the underlying first bonding wire 430*a* may partially overlap each other.

Because the first substrate pads 122 and the second substrate pads 124 arranged along the second side surface S2 of the package substrate 100 and used as two different channels CH1 and CH2 are located at different heights, that is, the second substrate pads 124 arranged relatively outside are at a higher position, interference between the first and second bonding wires 430*a* and 430*b* connected to the first and second bonding pads 122 and 124 may be mitigated or prevented.

Accordingly, the bonding wire process may be performed more easily, and the yield and productivity of the bonding wire process may be improved.

Figure 10:
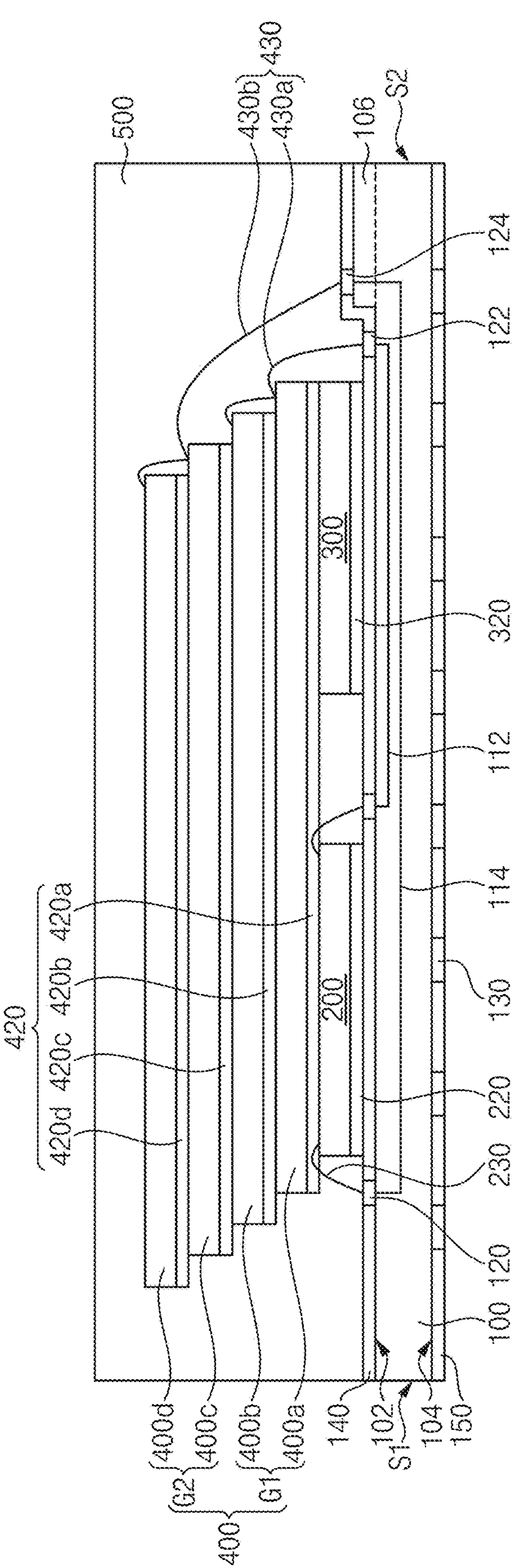

Referring to FIG. 10, a molding member 500 may be formed on the upper surface 102 of the package substrate 100 to cover the first semiconductor chip 200, the spacer chip 300 and the second semiconductor chips 400. The molding member 500 may include epoxy molding compound (EMC).

Then, outer connection members 600 may be formed on outer connection pads 130 on the lower surface 104 of the package substrate 100, to complete a semiconductor package 10 in FIG. 1.

Figure 11:
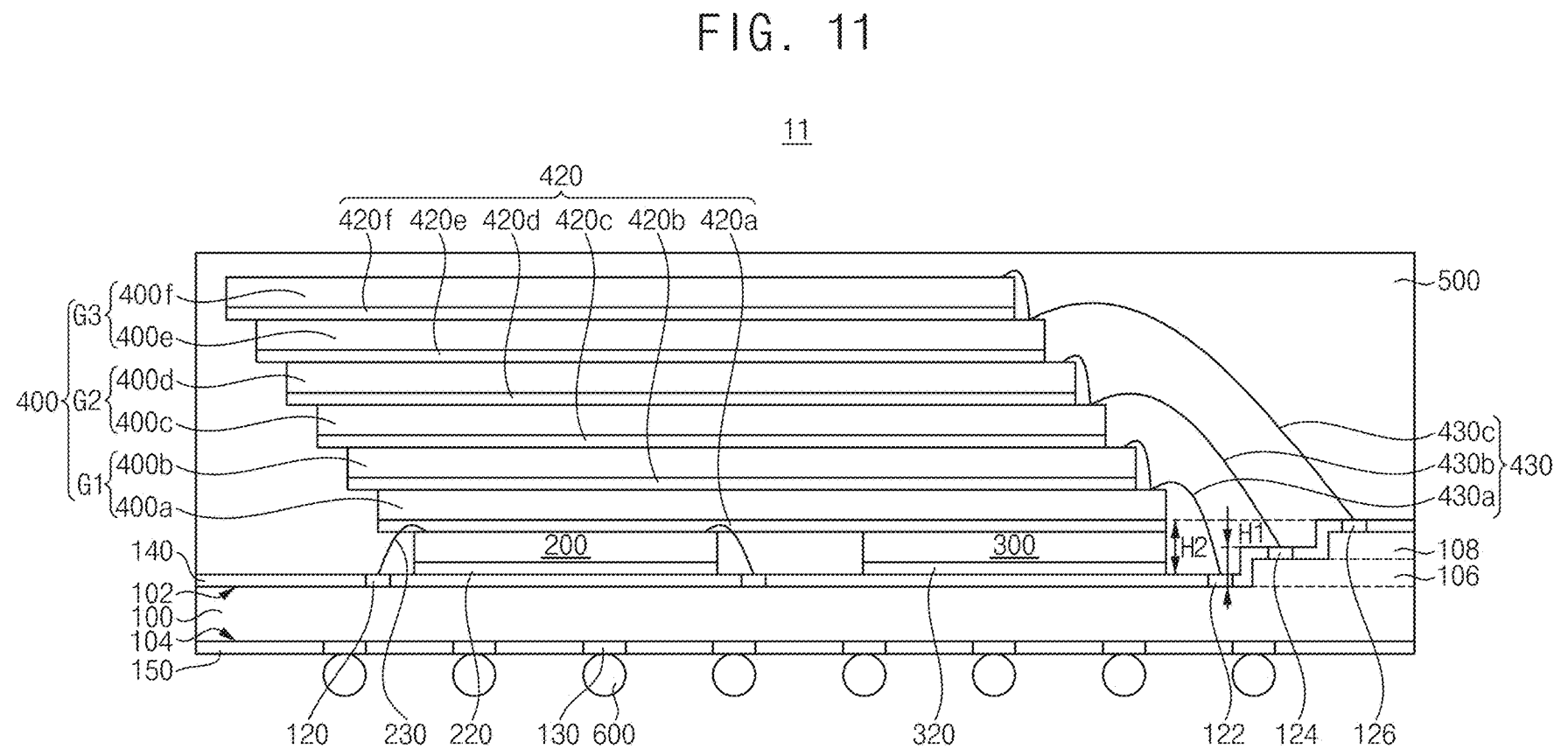
Figure 12:
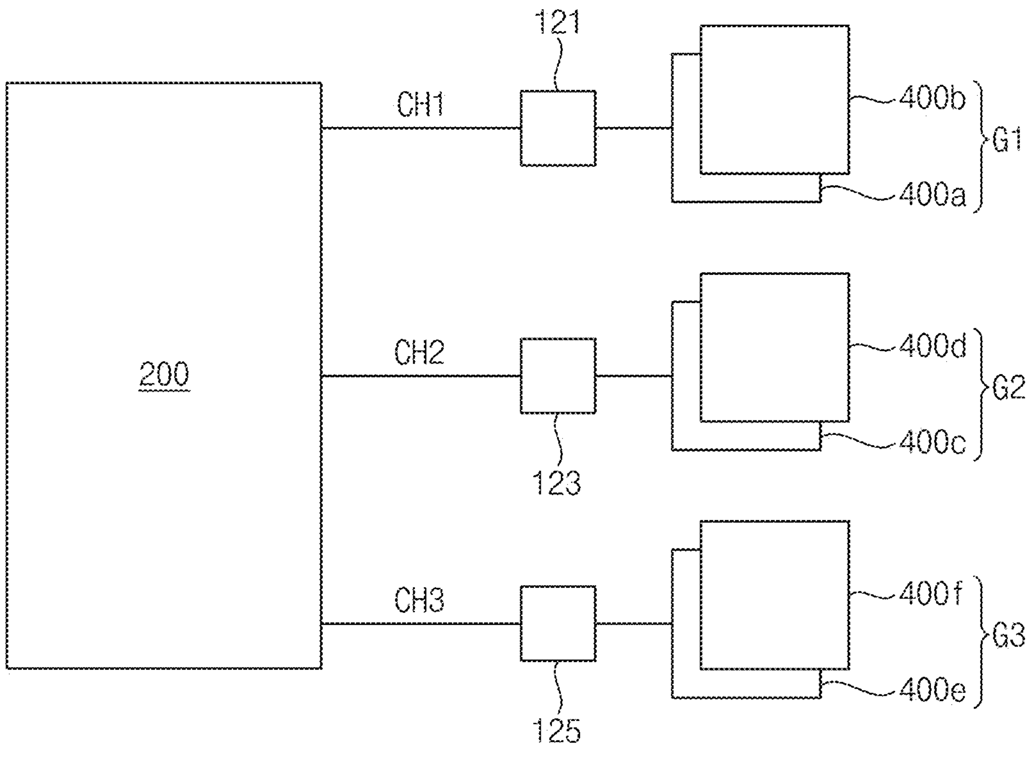

FIG. 11 is a cross-sectional view illustrating a semiconductor package in accordance with an example embodiment. FIG. 12 is a block diagram illustrating signal transmission channels in the semiconductor package in FIG. 11. The semiconductor package may be the same as or substantially similar to the semiconductor package described with reference to FIG. 1 except for configurations of additional second semiconductor chips and signal transmission channels. Thus, same reference numerals will be used to refer to the same or like elements and any further repetitive explanation concerning the above elements will be omitted.

Referring to FIGS. 11 and 12, a semiconductor package 11 may include a package substrate 100, a first semiconductor chip 200, a spacer chip 300, a plurality of second semiconductor chips 400 and a molding member 500. Additionally, the semiconductor package 11 may further include outer connection members 600.

In some example embodiments, substrate pads of the package substrate 100 may include first pads 120 for electrical connection with the first semiconductor chip 200, first substrate pads 122 of a first substrate pad portion 121 provided as a portion of a first channel CH1, second substrate pads 124 of a second substrate pad portion 123 provided as a portion of a second channel CH2, and third substrate pads 126 of a third substrate pad portion 125 provided as a portion of a third channel CH3. The first substrate pads 122 may constitute a portion of the first channel CH1, the second substrate pads 124 may constitute a portion of the second channel CH2, and the third substrate pads 126 may constitute a portion of the third channel CH3.

When viewed from plan view, the second substrate pads 124 may be arranged outside the first substrate pads 122, and the third substrate pads 126 may be arranged outside the second substrate pads 124.

In some example embodiments, the second semiconductor chips 400 may include a first group G1 of the second semiconductor chips, a second group G2 of the second semiconductor chips and a third group G3 of the second semiconductor chips.

The first group G1 of the second semiconductor chips as a first stack structure may be sequentially stacked on the first semiconductor chip 200 on the upper surface 102 of the package substrate 100, and may include at least two second semiconductor chips 400*a*, 400*b*. The first group G1 of the second semiconductor chips may include a lowermost semiconductor chip 400*a* among the second semiconductor chips 400. The second group G2 of the second semiconductor chips as a second stack structure may be sequentially stacked on the first group G1 of the second semiconductor chips, and may include at least two second semiconductor chips 400*c*, 400*d*. The third group G3 of the second semiconductor chips as a third stack structure may be sequentially stacked on the second group G2 of the second semiconductor chips, and may include at least two second semiconductor chips 400*e*, 400*f*. The third group G3 of the second semiconductor chips may include an uppermost semiconductor chip 400*f* among the second semiconductor chips 400. The types and numbers the first to third groups of second semiconductor chips of may not be limited thereto.

In some example embodiments, the second semiconductor chips 400 may be electrically connected to the package substrate 100 by conductive connection members 430.

For example, chip pads of the first group G1 of the second semiconductor chips 400*a*, 400*b* may be electrically connected to the first substrate pads 122 by first bonding wires 430*a*. Chip pads of the second group G2 of the second semiconductor chips 400*c*, 400*d* may be electrically connected to the second substrate pads 124 by second bonding wires 430*b*. Chip pads of the third group G3 of the second semiconductor chips 400*e*, 400*f* may be electrically connected to the third substrate pads 126 by third bonding wires 430*c*.

As illustrated in FIG. 12, the second semiconductor chips 400 may be electrically connected to the first semiconductor chip 200 by three channels CH1, CH2 and CH3.

The first group G1 of the second semiconductor chips 400*a*, 400*b* may be electrically connected to the first semiconductor chip 200 by a first channel CH1. Two second semiconductor chips 400*a*, 400*b* may share the first channel CH1.

The second group G2 of the second semiconductor chips 400*c*, 400*d* may be electrically connected to the first semiconductor chip 200 by a second channel CH2. Two second semiconductor chips 400*c*, 400*c* may share the second channel CH2.

The third group G3 of the second semiconductor chips 400*e*, 400*f* may be electrically connected to the first semiconductor chip 200 by a third channel CH3. Two second semiconductor chips 400*e*, 400*f* may share the third channel CH3.

In some example embodiments, the second substrate pads 124 may be arranged at higher positions than the first substrate pads 122, and the third substrate pads 126 may be arranged at higher positions than the second substrate pads 124. The first substrate pads 122 have a first height from the upper surface 102 of the package substrate 100, the second substrate pads 124 have a second height, which is greater than the first height, from the upper surface 102 of the package substrate 100, and the third substrate pads 126 have a third height, which is greater than the second height, from the upper surface 102 of the package substrate 100.

For example, the package substrate 100 may have a first stepped portion 106 that extends along the second side portion S2 and protrudes from the upper surface 102 to have a desired (or alternatively, predetermined) first thickness and a second stepped portion 108 that extends along the second side portion S2 and protrudes from the upper surface 102 to have a desired (or alternatively, predetermined) second thickness. The second substrate pads 124 may be disposed on the first stepped portion 106. The third substrate pads 126 may be disposed on the second stepped portion 108.

Because the first substrate pads 122, the second substrate pads 124 and the third substrate pads 126 arranged along the second side surface S2 of the package substrate 100 and used as three different channels CH1, CH2 and CH3 are located at different heights, that is, interferences between the first, second and third bonding wires 430*a*, 430*b* and 430*c* connected to the first, second and third bonding pads 122, 124 and 126 may be mitigated or prevented.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, or ReRAM devices.

The foregoing is illustrative of some example embodiments and is not to be construed as limiting thereof. Although a few example embodiments have been described, those skilled in the art will readily appreciate that many modifications are possible in the disclosed example embodiments without materially departing from the novel teachings and advantages of the present inventive concepts. Accordingly, all such modifications are intended to be included within the scope of example embodiments as defined in the claims.

What is claimed is:

1. A semiconductor package, comprising:

a package substrate being a single integral body and having an upper surface and a lower surface opposite to the upper surface, the upper surface including a first portion and a second portion outside the first portion, the second portion being a stepped portion that extends along a side portion of the package substrate and protrudes to a thickness relative to the first portion, the package substrate having first substrate pads and second substrate pads, the first substrate pads being along a side portion of the first portion, the second substrate pads being outside the first substrate pads and being on the second portion;

a first group of semiconductor chips sequentially stacked on the upper surface of the package substrate, the first group of semiconductor chips including at least one first semiconductor chip;

a second group of semiconductor chips sequentially stacked on the first group of semiconductor chips, the second group of semiconductor chips including at least one second semiconductor chip;

first bonding wires electrically connecting first chip pads of the first group of semiconductor chips to the first substrate pads of the package substrate, respectively; and second bonding wires electrically connecting second chip pads of the second group of semiconductor chips to the second substrate pads of the package substrate, respectively.

2. The semiconductor package of claim 1, wherein a height difference between the second substrate pads and the first substrate pads is within a range of 20 μm to 60 μm.

3. The semiconductor package of claim 1, wherein when viewed from plan view, a minimum distance between the first substrate pads and the first group of semiconductor chips is at least 400 μm.

4. The semiconductor package of claim 1, wherein when viewed from plan view, a minimum distance between the second substrate pads and the first group of semiconductor chips is at least 550 μm.

5. The semiconductor package of claim 1, wherein when viewed from plan view, at least one of the first bonding wires connects a first subset of the first chip pads to a corresponding one of the first substrate pads, at least one of the second bonding wires connects a second subset of the second chip pads to a corresponding one of the second substrate pads, the first subset of the first chip pads and the second subset of the second chip pads are on a same line along one direction, and the at least one of the first bonding wires and the at least one of the second bonding wires partially overlap each other.

6. The semiconductor package of claim 1, further comprising:

a second semiconductor chip being on the package substrate, wherein the first group of semiconductor chips and the second group of semiconductor chips are stacked on the second semiconductor chip.

7. The semiconductor package of claim 6, wherein the first group of semiconductor chips are electrically connected to the second semiconductor chip by a first channel through the first substrate pads, and the second group of semiconductor chips are electrically connected to the second semiconductor chip by a second channel through the second substrate pads.

8. The semiconductor package of claim 6, further comprising:

a spacer chip on the package substrate to be spaced apart from the second semiconductor chip, wherein the first group of semiconductor chips and the second group of semiconductor chips are stacked on the second semiconductor chip and the spacer chip.

9. The semiconductor package of claim 1, further comprising:

a molding member on the upper surface of the package substrate to cover the first group of semiconductor chips and the second group of semiconductor chips.

10. A semiconductor package, comprising:

a package substrate being a single integral body and having an upper surface and a lower surface opposite to the upper surface, the upper surface including a first side portion and a second side portion outside the first side portion, the first side portion having a first height, the second side portion protruding to a thickness relative to the first side portion, the package substrate having first substrate pads and second substrate pads, the first substrate pads being along the first side portion thereof, the second substrate pads being outside the first substrate pads, being along the second side portion;

a plurality of semiconductor chips sequentially stacked on the upper surface of the package substrate, the plurality of semiconductor chips including a first group of semiconductor chips and a second group of semiconductor chips;

first bonding wires electrically connecting first chip pads of the first group of semiconductor chips to the first substrate pads of the package substrate, respectively, the first group of semiconductor chips including a lowermost semiconductor chip of the plurality of semiconductor chips;

second bonding wires electrically connecting second chip pads of the second group of semiconductor chips to the second substrate pads of the package substrate, respectively, the second group of semiconductor chips including an uppermost semiconductor chip of the plurality of semiconductor chips; and a molding member on the upper surface of the package substrate to cover the plurality of semiconductor chips.

11. The semiconductor package of claim 10, wherein a difference between the second substrate pads and the first substrate pads is within a range of 20 μm to 60 μm.

12. The semiconductor package of claim 10, wherein when viewed from plan view, a minimum distance between the first substrate pads and the first group of semiconductor chips is at least 400 μm.

13. The semiconductor package of claim 10, wherein when viewed from plan view, a minimum distance between the second substrate pads and the second group of semiconductor chips is at least 550 μm.

14. The semiconductor package of claim 10, wherein when viewed from plan view, at least one of the first bonding wires connects a first subset of the first chip pads to a corresponding one of the first substrate pads, at least one of the second bonding wires connects a second subset of the second chip pads to a corresponding one of the second substrate pads, the first subset of the first chip pads and the second subset of the second chip pads are on a same line along one direction, and the at least one of the first bonding wires and the at least one of the second bonding wires partially overlap each other.

15. The semiconductor package of claim 10, further comprising:

another semiconductor chip being on the package substrate, wherein the first group of semiconductor chips and the second group of semiconductor chips are stacked on the another semiconductor chip.

16. The semiconductor package of claim 15, wherein the first group of semiconductor chips are electrically connected to the another semiconductor chip by a first channel through the first substrate pads, the second group of semiconductor chips are electrically connected to the another semiconductor chip by a second channel through the second substrate pads, and the another semiconductor chip is a logic chip and is adhered onto the package substrate by an adhesive member.

17. The semiconductor package of claim 15, further comprising:

a spacer chip on the package substrate and spaced apart from the another semiconductor chip, wherein the first group of semiconductor chips and the second group of semiconductor chips are stacked on the another semiconductor chip and the spacer chip.

18. A semiconductor package, comprising:

a package substrate being a single integral body and having an upper surface and a lower surface opposite to the upper surface, the upper surface including a first portion and a second portion outside the first portion, the second portion being a stepped portion that extends along a side portion of the package substrate and protrudes to a thickness relative to the first portion;

a substrate pad portion having first substrate pads and second substrate pads, the first substrate pads being on the upper surface of the package substrate, the second substrate pads being on the stepped portion along the side portion;

a first semiconductor chip on the upper surface of the package substrate;

a spacer chip on the upper surface of the package substrate and spaced apart from the first semiconductor chip;

a plurality of semiconductor chips sequentially stacked on the first semiconductor chip and the spacer chip;

first bonding wires electrically connecting first chip pads of a first group of the plurality of semiconductor chips to the first substrate pads of the package substrate, respectively, the first group of the plurality of semiconductor chips including a lowermost semiconductor chip of the plurality of semiconductor chips;

second bonding wires electrically connecting second chip pads of a second group of the plurality of semiconductor chips to the second substrate pads of the package substrate, respectively, the second group of the plurality of semiconductor chips including an uppermost semiconductor chip of the plurality of semiconductor chips; and a molding member on the upper surface of the package substrate to cover the first semiconductor chip, the spacer chip, and the plurality of semiconductor chips.

* * * * *